US009099321B2

(12) United States Patent
Lin (10) Patent No.: US 9,099,321 B2
(45) Date of Patent: Aug. 4, 2015

(54) METHOD FOR FABRICATING POWER SEMICONDUCTOR DEVICE (71) Applicant: Anpec Electronics Corporation, Hsin-Chu (TW)

(72) Inventor: Yung-Fa Lin, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 11 days.

(21) Appl. No.: 13/920,033

(22) Filed: Jun. 17, 2013

(65) Prior Publication Data

US 2014/0308788 A1  Oct. 16, 2014

(30) Foreign Application Priority Data

Apr. 11, 2013 (TW) ................. 102112923

(51) Int. Cl.
*H01L 21/8242* (2006.01)
*H01L 29/06* (2006.01)
*H01L 21/22* (2006.01)
*H01L 21/265* (2006.01)
*H01L 29/10* (2006.01)
*H01L 29/66* (2006.01)

(52) U.S. Cl.
CPC .............. *H01L 29/063* (2013.01); *H01L 21/22* (2013.01); *H01L 21/265* (2013.01); *H01L 29/105* (2013.01); *H01L 29/66712* (2013.01)

(58) Field of Classification Search
CPC ................................................. H01L 29/41766
See application file for complete search history.

(56) References Cited

U.S. PATENT DOCUMENTS

| 5,321,298 | A  | * | 6/1994  | Moslehi       | 257/506 |
| 6,794,698 | B1 | * | 9/2004  | Perng et al.  | 257/296 |
| 6,969,648 | B2 | * | 11/2005 | Cheng et al.  | 438/249 |
| 7,358,108 | B2 | * | 4/2008  | Han et al.    | 438/60  |
| 7,910,437 | B1 | * | 3/2011  | Baek et al.   | 438/268 |
| 8,093,651 | B2 |   | 1/2012  | Bhalla        |         |
| 8,338,887 | B2 | * | 12/2012 | Lindsay et al.| 257/330 |
| 8,362,547 | B2 | * | 1/2013  | Bhalla et al. | 257/330 |
| 8,426,275 | B2 | * | 4/2013  | Tu et al.     | 438/270 |
| 8,766,398 | B2 | * | 7/2014  | Bowman        | 257/510 |
| 2011/0318895 | A1 |   | 12/2011 | Tu        |         |

FOREIGN PATENT DOCUMENTS

TW          201239995         10/2012

* cited by examiner

*Primary Examiner* — Zandra Smith
*Assistant Examiner* — Andre' C Stevenson
(74) *Attorney, Agent, or Firm* — Winston Hsu; Scott Margo (57) ABSTRACT A substrate having thereon an epitaxial layer is provided. A hard mask having a first opening is formed on the epitaxial layer. A first trench is etched into the epitaxial layer through the first opening. The hard mask is trimmed to widen the first opening to a second opening. An upper corner portion of the first trench is revealed. A dopant layer is filled into the first trench. The dopants are driven into the epitaxial layer to form a doped region within the first trench. The doped region includes a first region adjacent to the surface of the first trench and a second region farther from the surface. The entire dopant layer is then etched and the epitaxial layer within the first region is also etched away to form a second trench.

21 Claims, 13 Drawing Sheets

METHOD FOR FABRICATING POWER SEMICONDUCTOR DEVICE

BACKGROUND OF THE INVENTION

1. Field of the Invention

The present invention relates generally to the field of semiconductor technology. More particularly, the present invention relates to a method for fabricating a power semiconductor device with super junction structure.

2. Description of the Prior Art

As known in the art, super junction power MOSFET devices include alternating p-type and n-type regions below the active regions of the device. The alternating p-type and n-type regions in a super junction power MOSFET device are ideally in charge balance so that those regions deplete one another under a reverse voltage condition, thereby enabling the device to better withstand breakdown.

It is known to utilize super junction structures in trench type power devices. To form such trench type super junction power devices, typically, deep trenches are etched into a main surface of a semiconductor substrate, and an epitaxial layer is then formed to fill the deep trenches. However, the prior art fabrication method has drawbacks. For example, the surface concentration of the dopants driven into the trench surfaces is too high. This leads to non-uniformity of the carrier concentration distribution.

SUMMARY OF THE INVENTION

It is therefore one object of the present invention to provide an improved fabrication method to form trench type power semiconductor devices in order to solve the above-mentioned overlay problems.

According to one embodiment, a method for fabricating a power semiconductor device is provided. A semiconductor substrate is prepared. An epitaxial layer is then formed on the semiconductor substrate. A hard mask layer is then formed on the epitaxial layer. At least one first opening is formed in the hard mask layer. The epitaxial layer is then etched through the first opening to form at least one first trench. The hard mask layer is trimmed to enlarge the first opening to a second opening such that upper corners of the first trench are revealed. The first trench is then filled with a doped layer. A thermal drive-in process is performed to diffuse dopants from the doped layer into the epitaxial layer to thereby form a diffusion region in the first trench, wherein the diffusion region comprises a first region that is closer to surface of the first trench and a second region that is formed deeper into the epitaxial layer. Subsequently, a dry etching process is performed, using the trimmed hard mask layer as an etching hard mask, to completely etch away the doped layer and the epitaxial layer in the first region, thereby forming a second trench.

According to another embodiment, a method for fabricating a power semiconductor device is provided. First, a semiconductor substrate is prepared. An epitaxial layer is formed on the semiconductor substrate. A hard mask layer is then formed on the epitaxial layer. At least one first opening is formed in the hard mask layer. A spacer is then formed on sidewall of the first opening. Through the first opening, the epitaxial layer is etched to thereby form at least one first trench. The spacer is removed to reveal upper corners of the first trench. The first trench is then filled with a doped layer. A thermal drive-in process is performed to diffuse dopants from the doped layer into the epitaxial layer to thereby form a diffusion region in the first trench, wherein the diffusion region comprises a first region that is closer to surface of the first trench and a second region that is formed deeper into the epitaxial layer. A dry etching process is performed, using the hard mask layer as an etching hard mask, to completely etch away the doped layer and the epitaxial layer in the first region, thereby forming a second trench.

According to still another embodiment, a method for fabricating a power semiconductor device is provided. First, a semiconductor substrate is prepared. An epitaxial layer is formed on the semiconductor substrate. A hard mask layer is then formed on the epitaxial layer. A photoresist pattern is formed on the hard mask layer. The photoresist pattern has at least one first opening. The hard mask layer is etched through the first opening to form at least a second opening. The hard mask layer is trimmed to enlarge the second opening to a third opening. The epitaxial layer is then etched through the first opening to thereby form at least one first trench. The photoresist pattern is removed. The third opening and the first trench are filled with a doped layer. A thermal drive-in process is performed to diffuse dopants from the doped layer into the epitaxial layer to thereby form a diffusion region in the first trench, wherein the diffusion region comprises a first region that is closer to surface of the first trench and a second region that is formed deeper into the epitaxial layer. A dry etching process is performed, using the trimmed hard mask layer as an etching hard mask, to completely etch away the doped layer and the epitaxial layer in the first region, thereby forming a second trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-10 are schematic diagrams showing a method for fabricating a trench type power transistor device in accordance with one embodiment of the invention.

FIGS. 11-16 are schematic diagrams showing a method for fabricating a trench type power transistor device in accordance with another embodiment of the invention.

FIGS. 17-22 are schematic diagrams showing a method for fabricating a trench type power transistor device in accordance with still another embodiment of the invention.

DETAILED DESCRIPTION

In the following description, numerous specific details are given to provide a thorough understanding of the invention. It will, however, be apparent to one skilled in the art that the invention may be practiced without these specific details. Furthermore, some well-known process steps such as lithographic and etching processes are not disclosed in detail, as these should be well-known to those skilled in the art.

The terms wafer or substrate used herein includes any structure having an exposed surface onto which a layer may be deposited according to the present invention, for example, to form the integrated circuit (IC) structure. The term substrate is understood to include semiconductor wafers commonly used in this industry. The term substrate is also used to refer to semiconductor structures during processing, and may include other layers that have been fabricated thereupon. Both wafer and substrate may include doped and undoped semiconductors, epitaxial semiconductor layers supported by a base semiconductor or insulator, as well as other semiconductor structures well known to one skilled in the art.

Figure 1:
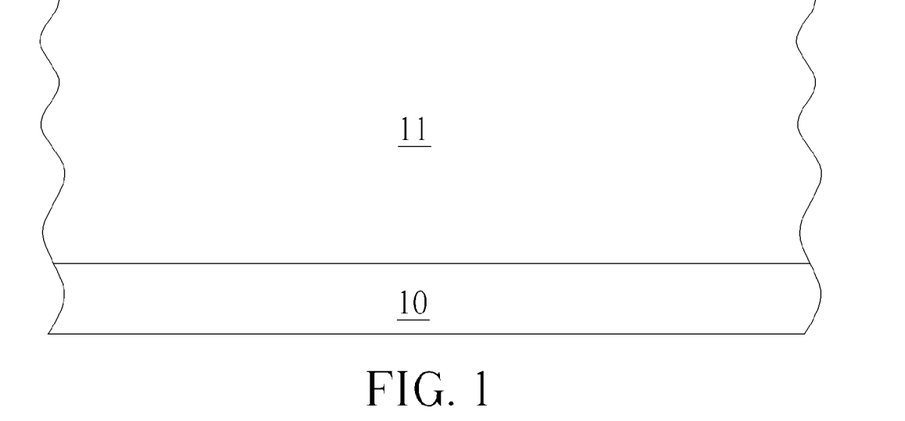

Please refer to FIGS. 1-10. FIGS. 1-10 are schematic diagrams showing a method for fabricating a trench type power transistor device in accordance with one embodiment of the invention. As shown in FIG. 1, a semiconductor substrate 10 having a fist conductivity type is provided. For example, the semiconductor substrate 10 may be an N+ heavily doped silicon substrate or wafer and may be act as a drain of the transistor device. An epitaxial growth process is performed to form an epitaxial layer 11 such as an N type epitaxial silicon layer or a P type epitaxial silicon layer on the semiconductor substrate 10.

Figure 2:
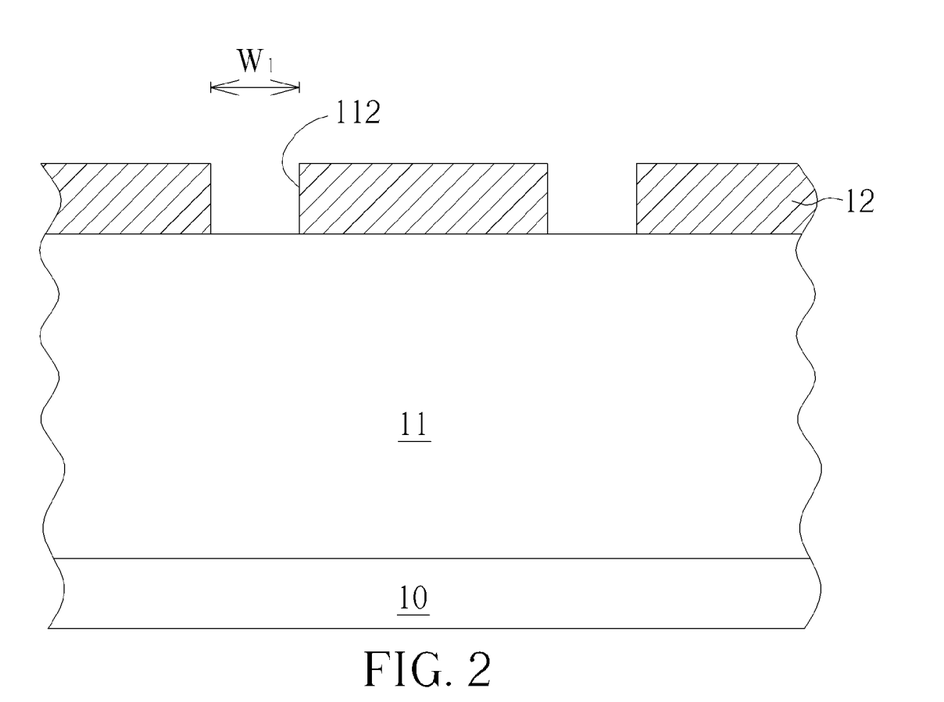

As shown in FIG. 2, a hard mask layer 12 such as a silicon oxide layer or silicon nitride layer is formed on a top surface of the epitaxial layer 11. A lithographic process and an etching process are carried out to form openings 112 in the hard mask layer 12. For example, the openings 112 are straight line-shaped and each of the openings 112 has a width W1.

Figure 3:
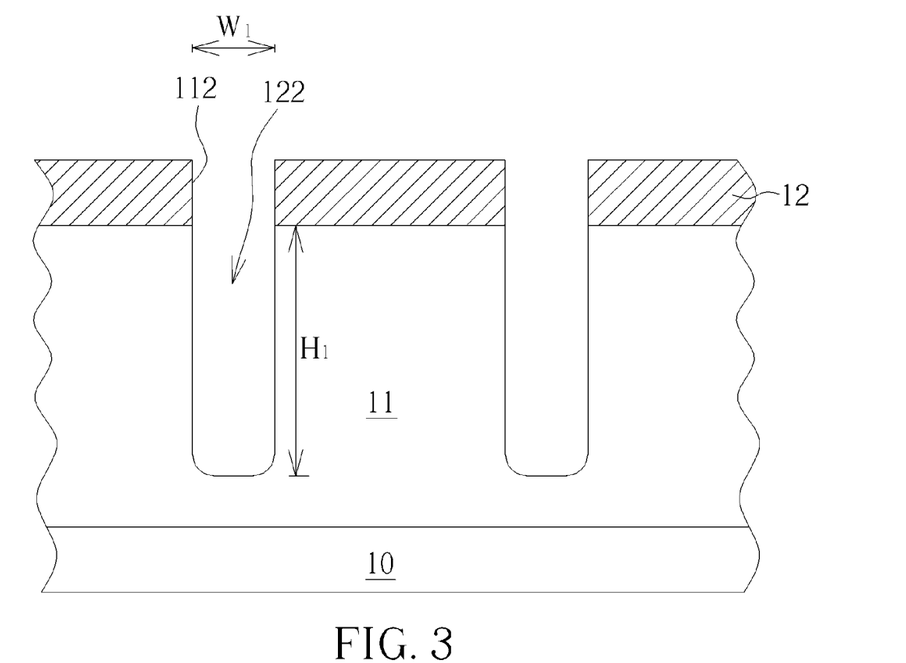

As shown in FIG. 3, a dry etching process is performed to etch the epitaxial layer 11 through the openings 112 in the hard mask layer 12 to a depth H1, thereby forming trenches 122. Each of the trenches 122 has a width that is equal to the width W1. The depth H1 is smaller than the thickness of the epitaxial layer 11.

Figure 4:
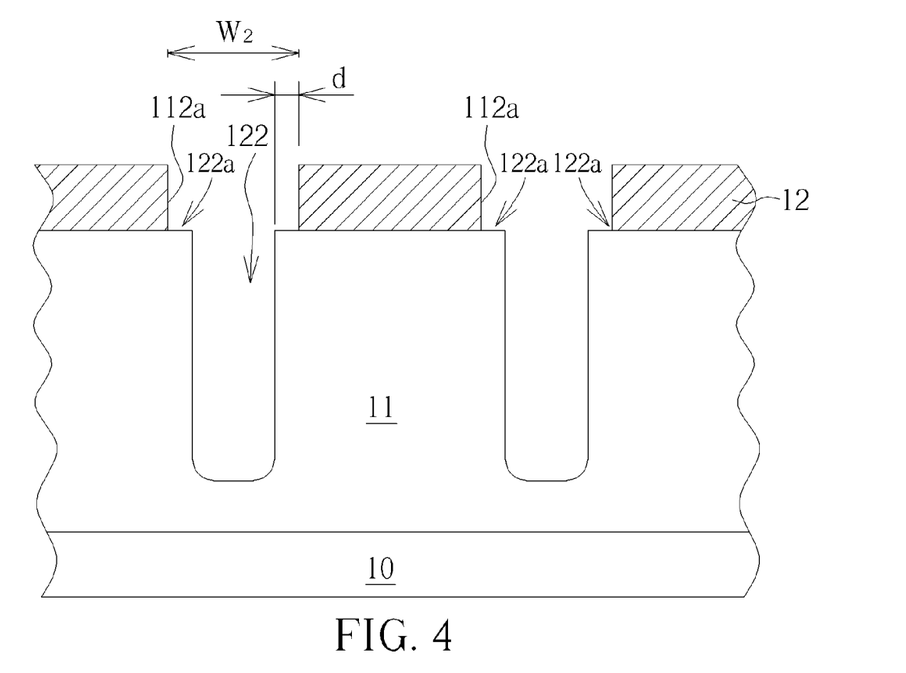

As shown in FIG. 4, a hard mask trimming process is carried out. For example, a wet etching process may be used to remove a portion of the hard mask layer 12. The removed portion has a thickness d such that the opening 112 having the width W1 is enlarged to an opening 112a having a width W2. The upper corners 122a around the upper ends of the trench 122 are exposed. According to the embodiment, the width d may be about 0.5 micrometers, but not limited thereto.

Figure 5:
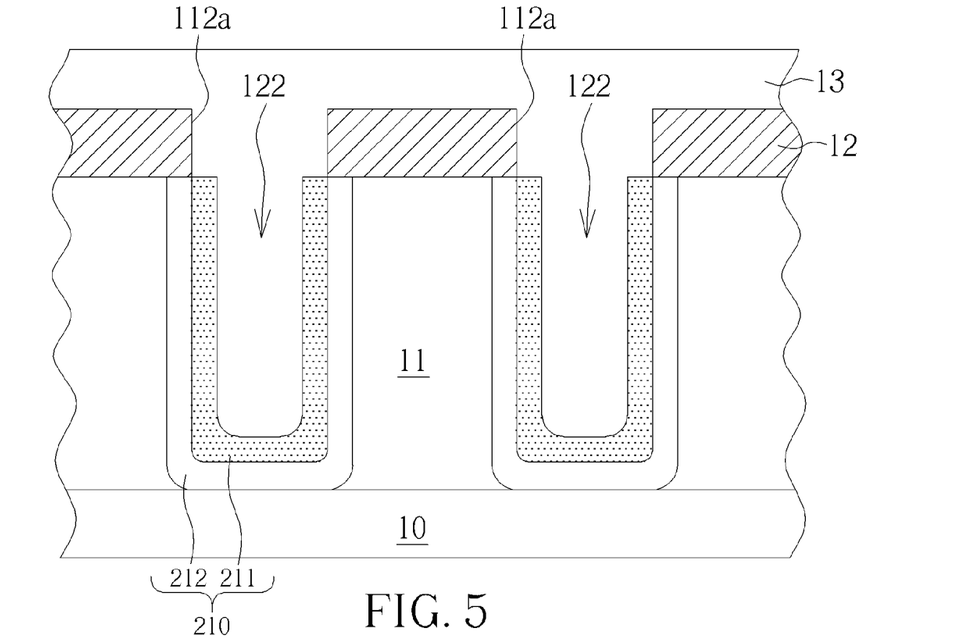

As shown in FIG. 5, the trenches 122 are filled with a doped polysilicon layer 13. According to the embodiment, the doped polysilicon layer 13 has a conductivity type that is opposite to the epitaxial layer 11. For example, when the epitaxial layer 11 is N type, the doped polysilicon layer 13 is P type and when the epitaxial layer 11 is P type, the doped polysilicon layer 13 is N type. According to the embodiment, the epitaxial layer 11 is N type. According to the embodiment, the doped polysilicon layer 13 may cover the hard mask layer 12. A high-temperature thermal drive-in process is then performed to diffuse dopants from the doped polysilicon layer 13 into the epitaxial layer 11, thereby forming the PN super junction structure.

At this point, the diffusion region 210 diffused into the epitaxial layer 11 includes a first region 211 that is closer to the surface of the trench 122 and a second region 212 that is formed deeper into the epitaxial layer 11. The first region 211 has a doping concentration that is higher than that of the second region 212. For example, the doping concentration of the first region 211 ranges between about 1E17 atoms/cm3 and 1E19 atoms/cm3, and the doping concentration of the second region 212 may be about 1E16 atoms/cm3, but not limited thereto. According to the embodiment, the width of the first region 211 is substantially equal to the width d of the removed portion of the hard mask layer 12.

Figure 6:
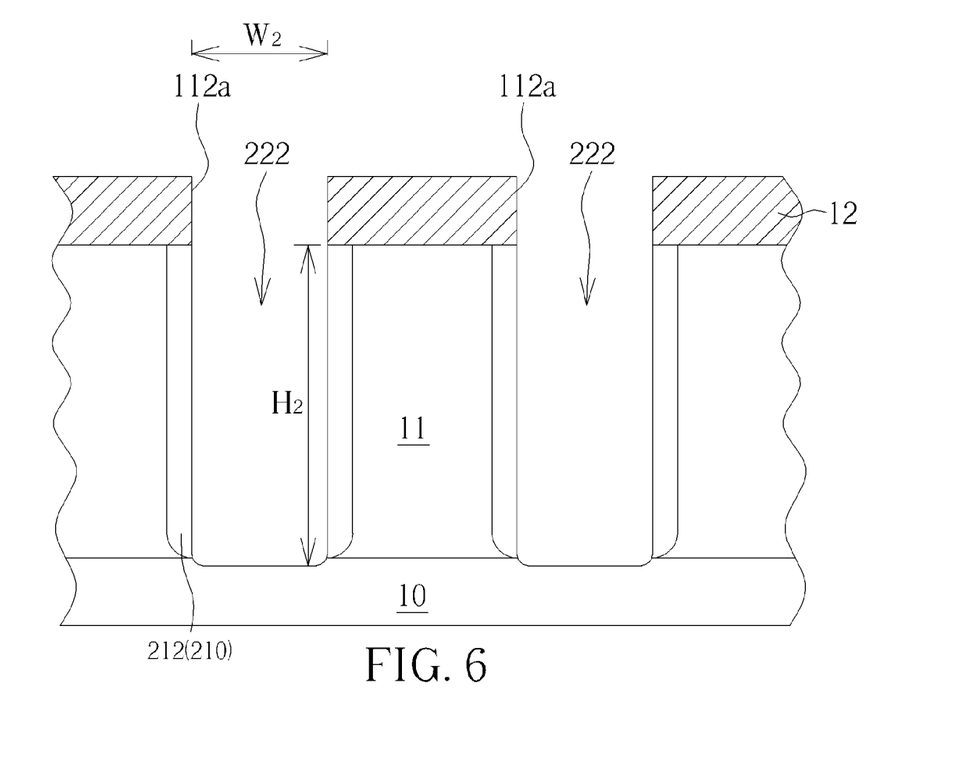

As shown in FIG. 6, a dry etching process is then performed, using the hard mask layer 12 as an etching hard mask, to completely etch away the doped polysilicon layer 13 and the epitaxial layer 11 in the first region 211, thereby forming trenches 222. The trench 222 has a width that is substantially equal to the width W2 of the opening 112a. The trench 222 has a depth H2 that is greater than the depth H1 of the trench 122. The depth H2 may be greater than or equal to the thickness of the epitaxial layer 11. It is noteworthy that when the epitaxial layer 11 is N type, the aforesaid trenches 222 may have an etched depth either penetrating through the epitaxial layer 11 or not penetrating through the epitaxial layer 11. However, when the epitaxial layer 11 is P type, the trenches 222 has an etched depth that has to be penetrating through the epitaxial layer 11.

Figure 7:
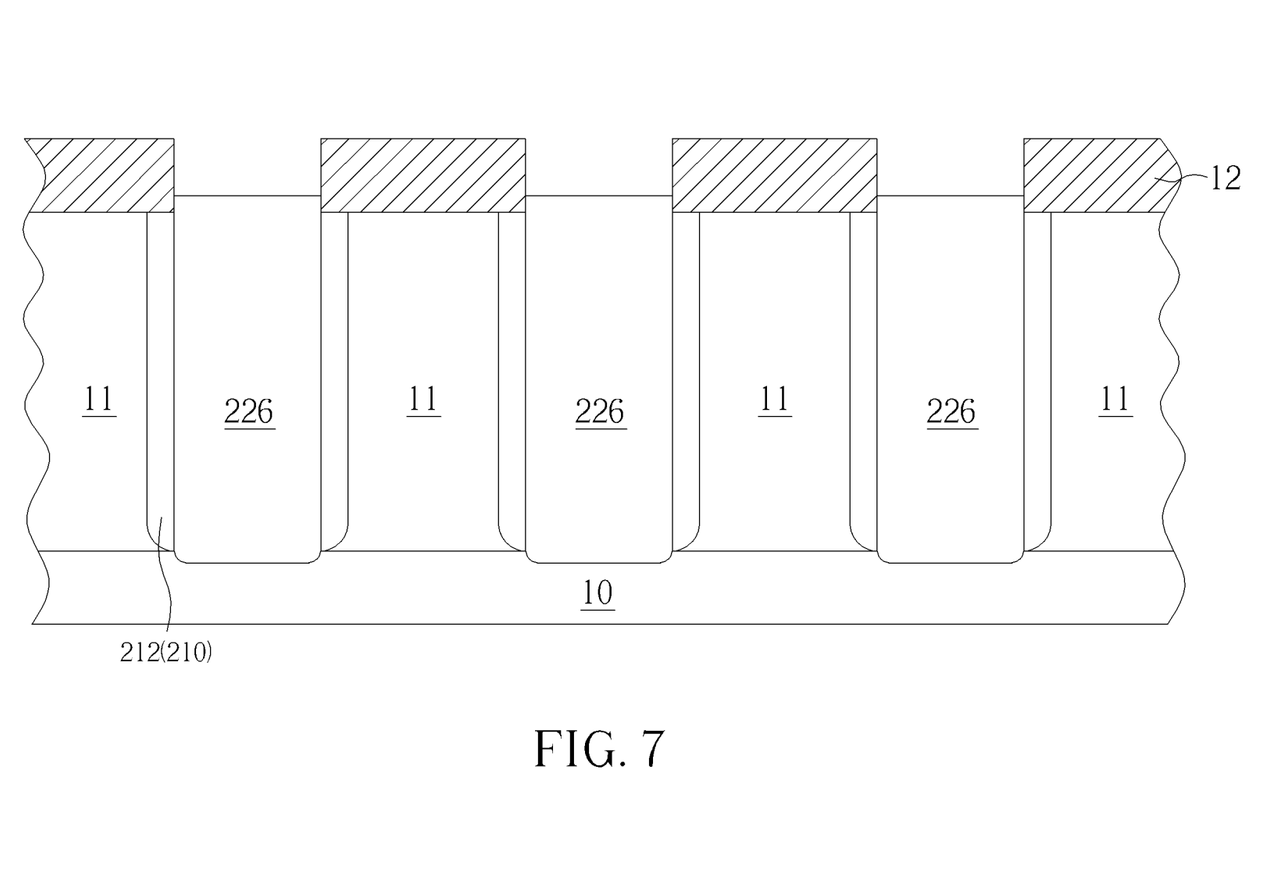

As shown in FIG. 7, a silicon oxide layer 226 is then deposited. The silicon oxide layer 226 fills the trenches 222. Prior to the deposition of the silicon oxide layer 226, an oxidation process may be performed to form a sacrificial layer (not shown) on the surface of the trenches 222. The sacrificial layer is then etched and removed. A chemical mechanical polishing (CMP) process is then performed to polish and remove the silicon oxide layer 226 from the surface of the hard mask layer 12. A portion of the silicon oxide layer 226 is then removed from the trenches 222 such that a top surface of the silicon oxide layer 226 is lower than the top surface of the hard mask layer 12.

Figure 8:
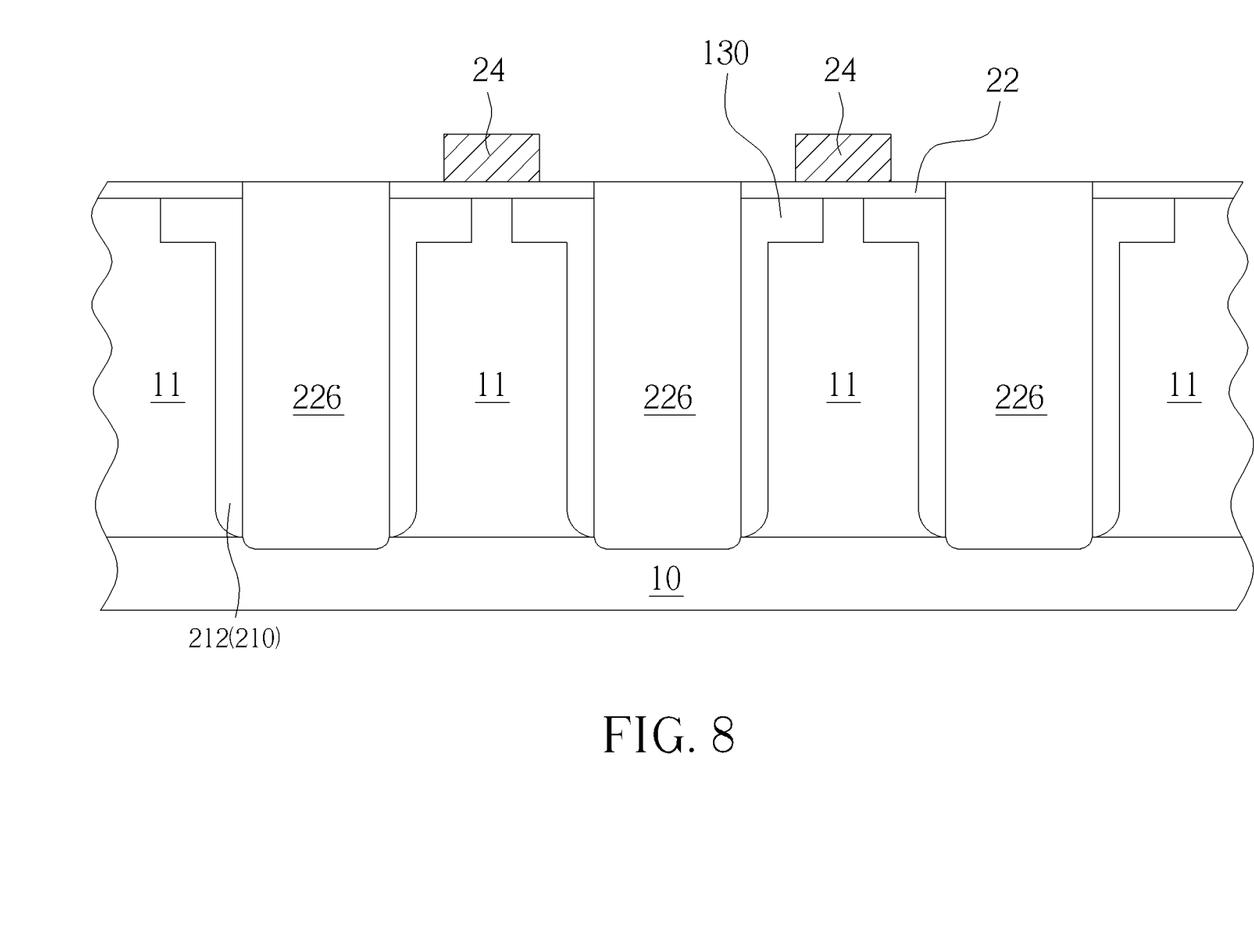

As shown in FIG. 8, the hard mask layer 12 is removed to reveal the top surface of the epitaxial layer 11. Subsequently, a gate oxide layer 22 and gates 24 are formed on the top surface of the epitaxial layer 11. According to the embodiment, the gates 24 may be polysilicon gates. An ion implantation process is then performed to implant dopants with the second conductivity type (e.g. P type) into the epitaxial layer 11 between two adjacent gates 24, thereby forming ion wells 130. Thereafter, a thermal drive-in process may be performed.

Figure 9:
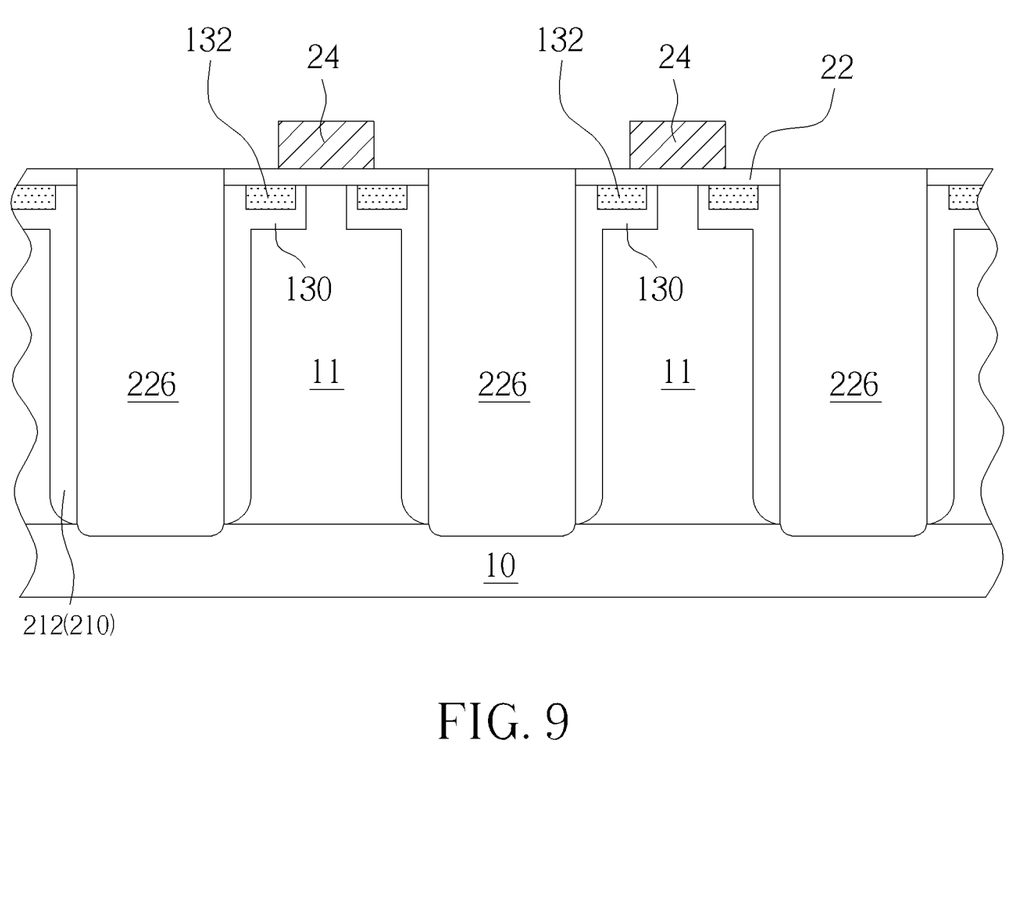

As shown in FIG. 9, by using a photoresist and a lithographic process, the regions to be formed as sources are defined. Subsequently, an ion implantation process is carried out to implant dopants with the first conductivity type (e.g. N type) into the ion wells 130, thereby forming the source doping regions 132. Thereafter, a thermal drive-in process may be performed.

Figure 10:
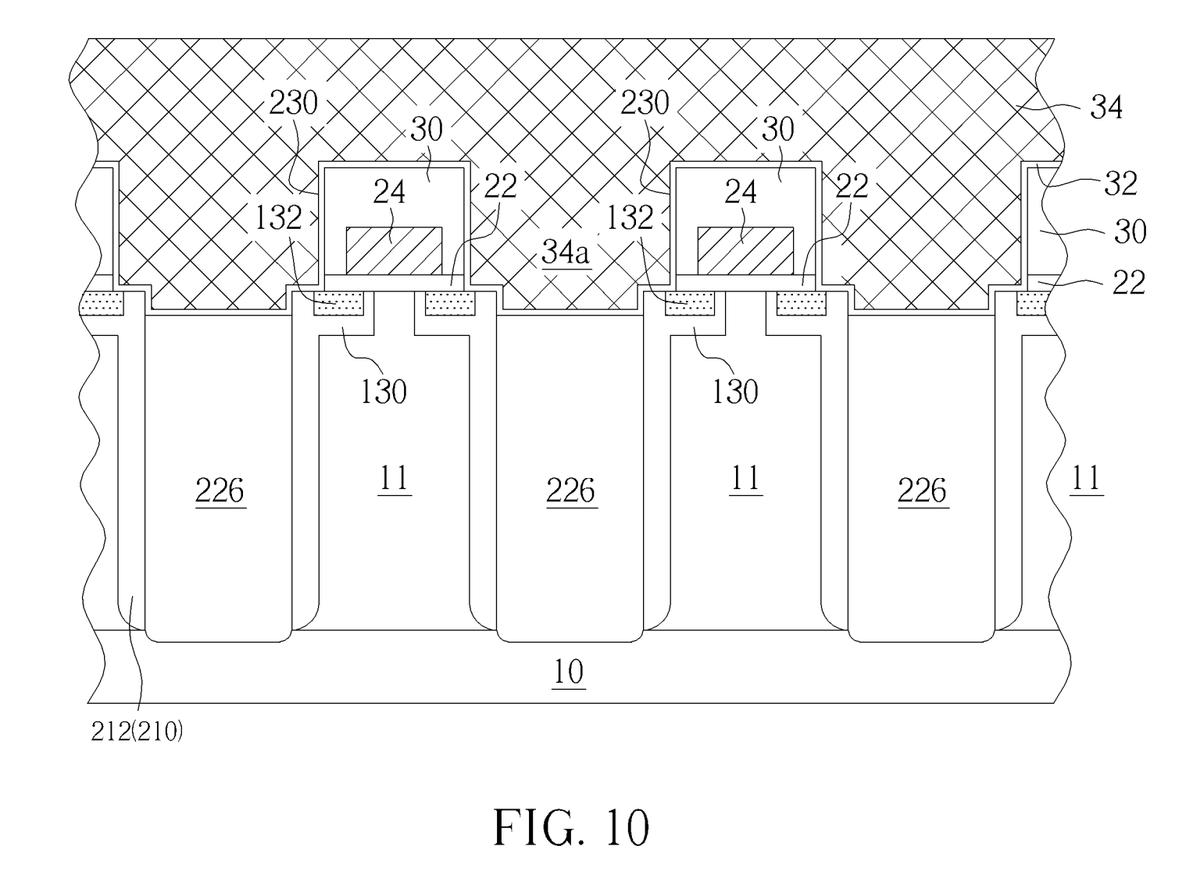

As shown in FIG. 10, contact holes are formed and metalized. To form the metalized contact holes, an inter-layer dielectric (ILD) layer 30 is first deposited. Then, contact holes 230 are formed in the ILD layer 30. The contact hole 230 reveals a portion of the ion well 130, the source doping region 132 and the silicon oxide layer 226. Barrier layer 32 and metal layer 34 are deposited to fill the contact holes 230, thereby forming the contact elements 34a in contact with the ion well 130 and the source doping regions 132.

Figure 11:
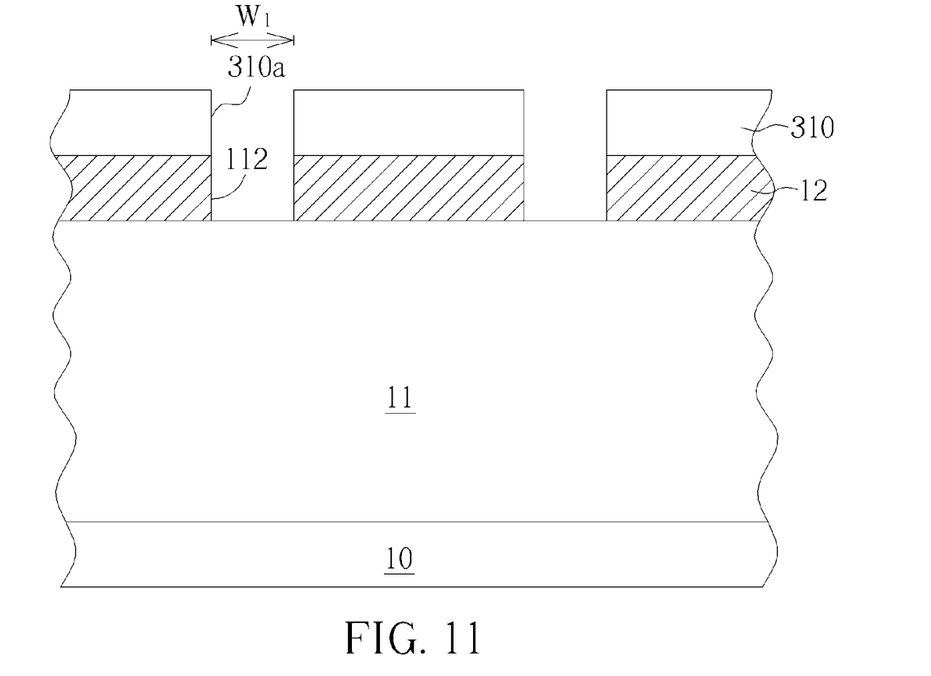

FIGS. 11-16 are schematic diagrams showing a method for fabricating a trench type power transistor device in accordance with another embodiment of the invention. As shown in FIG. 11, likewise, a semiconductor substrate 10 having a fist conductivity type is provided. For example, the semiconductor substrate 10 may be an N+ heavily doped silicon substrate or wafer and may be act as a drain of the transistor device. An epitaxial growth process is performed to form an epitaxial layer 11 such as an N type epitaxial silicon layer or a P type epitaxial silicon layer on the semiconductor substrate 10. A hard mask layer 12 such as a silicon oxide layer or silicon nitride layer is formed on a top surface of the epitaxial layer 11. A lithographic process is performed to form a photoresist pattern 310 on the hard mask layer 12. The photoresist pattern 310 has openings 310a. Each of the openings 310a has a width W1. An etching process is then carried out to form openings 112 in the hard mask layer 12. The openings 112 are straight line-shaped and each of the openings 112 has the width W1.

Figure 12:
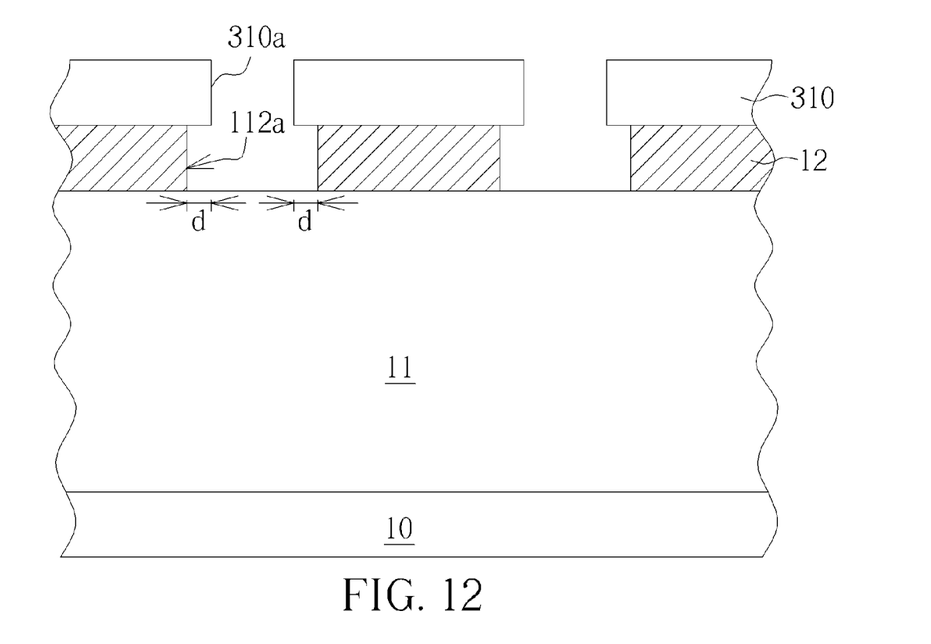

As shown in FIG. 12, a hard mask trimming process is carried out. For example, a wet etching process may be used to laterally remove a portion of the hard mask layer 12. The removed portion has a thickness d such that the opening 112 having the width W1 is now enlarged to an opening 112a having a width W2. The upper corners 122a around the upper ends of the trench 122 are exposed. According to the embodiment, the width d may be about 0.5 micrometers, but not limited thereto.

Figure 13:
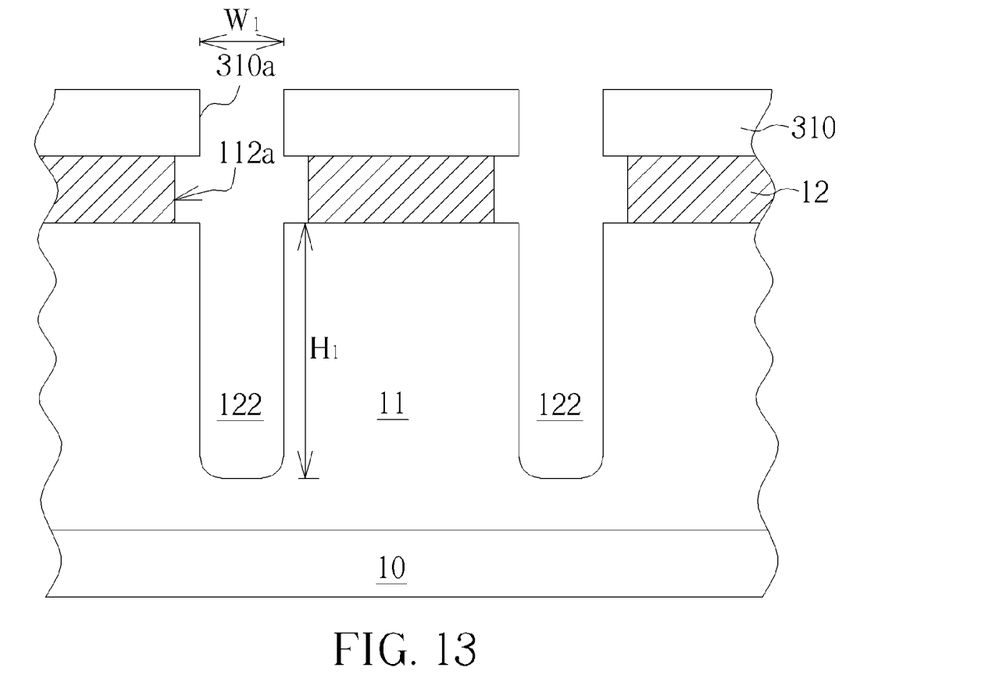

As shown in FIG. 13, an anisotropic dry etching process is performed to etch the epitaxial layer 11 through the openings 310a in the photoresist pattern 310 to a depth H1, thereby forming trenches 122. Each of the trenches 122 has a width that is equal to the width W1 of the opening 310a. The depth H1 is smaller than the thickness of the epitaxial layer 11.

Figure 14:
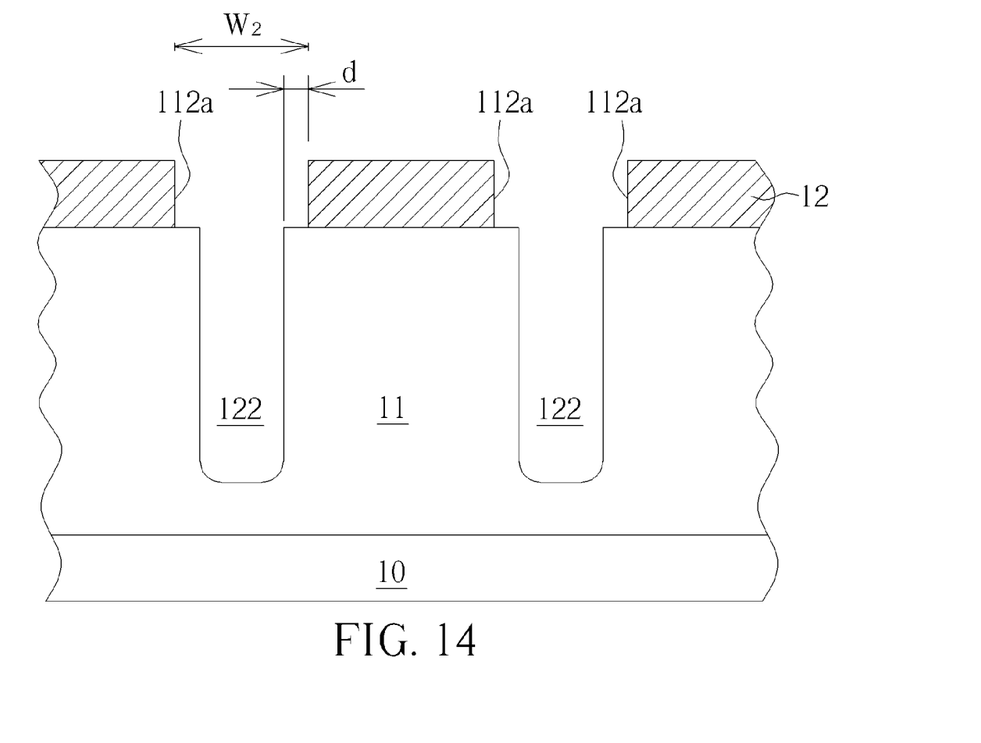

As shown in FIG. 14, after forming the trenches 122, the photoresist pattern 310 is completely removed to reveal the trimmed hard mask layer 12.

Figure 15:
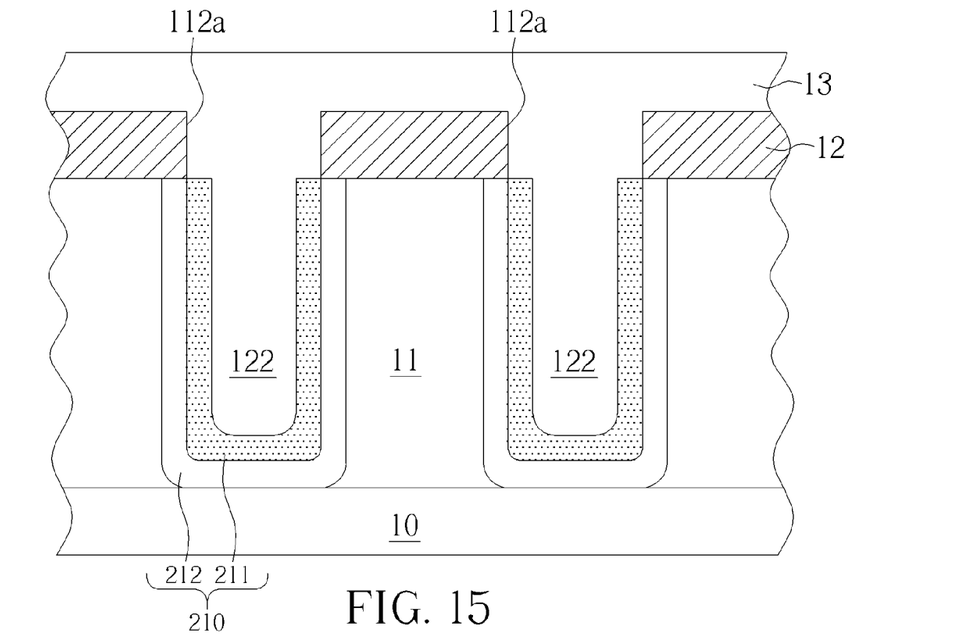

As shown in FIG. 15, the trenches 122 are filled with a doped polysilicon layer 13. According to the embodiment, the doped polysilicon layer 13 has a conductivity type that is opposite to the epitaxial layer 11. For example, when the epitaxial layer 11 is N type, the doped polysilicon layer 13 is P type and when the epitaxial layer 11 is P type, the doped polysilicon layer 13 is N type. According to the embodiment, the epitaxial layer 11 is N type. According to the embodiment, the doped polysilicon layer 13 may cover the hard mask layer 12. A high-temperature thermal drive-in process is then performed to diffuse dopants from the doped polysilicon layer 13 into the epitaxial layer 11, thereby forming the PN super junction structure.

At this point, the diffusion region 210 diffused into the epitaxial layer 11 includes a first region 211 that is closer to the surface of the trench 122 and a second region 212 that is formed deeper into the epitaxial layer 11. The first region 211 has a doping concentration that is higher than that of the second region 212. For example, the doping concentration of the first region 211 ranges between about 1E17 atoms/cm3 and 1E19 atoms/cm3, and the doping concentration of the second region 212 may be about 1E16 atoms/cm3, but not limited thereto. According to the embodiment, the width of the first region 211 is substantially equal to the width d of the removed portion of the hard mask layer 12.

Figure 16:
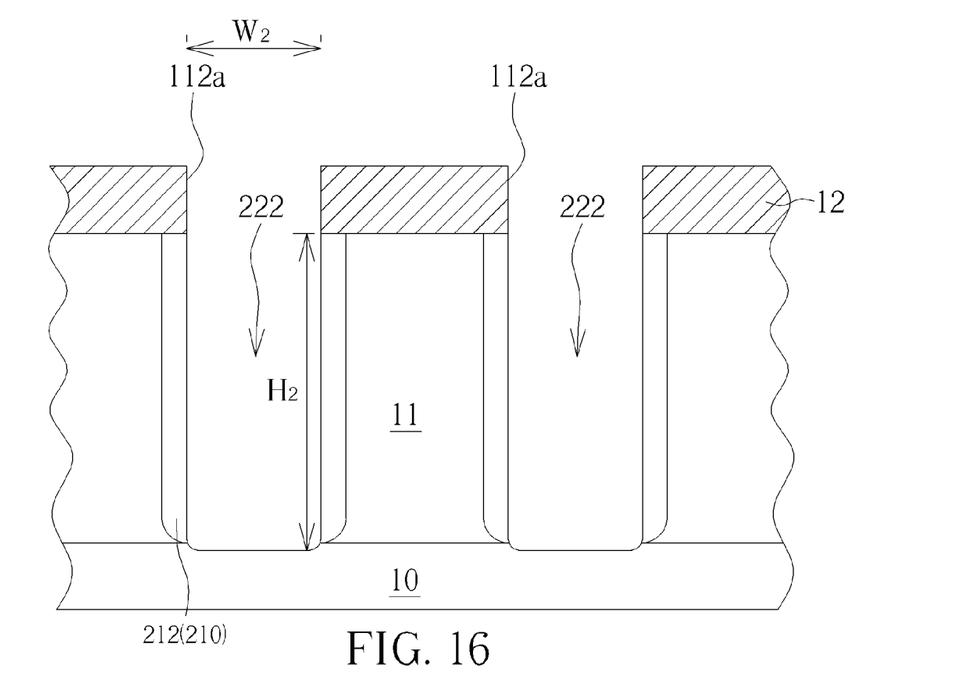

As shown in FIG. 16, a dry etching process is then performed, using the trimmed hard mask layer 12 as an etching hard mask, to completely etch away the doped polysilicon layer 13 and the epitaxial layer 11 in the first region 211, thereby forming trenches 222. The trench 222 has a width that is substantially equal to the width W2 of the opening 112a. The trench 222 has a depth H2 that is greater than the depth H1 of the trench 122. The depth H2 may be greater than or equal to the thickness of the epitaxial layer 11. It is noteworthy that when the epitaxial layer 11 is N type, the aforesaid trenches 222 may have an etched depth either penetrating through the epitaxial layer 11 or not penetrating through the epitaxial layer 11. However, when the epitaxial layer 11 is P type, the trenches 222 has an etched depth that has to be penetrating through the epitaxial layer 11. The subsequent steps are similar to the steps as described through FIG. 7 to FIG. 10.

Figure 17:
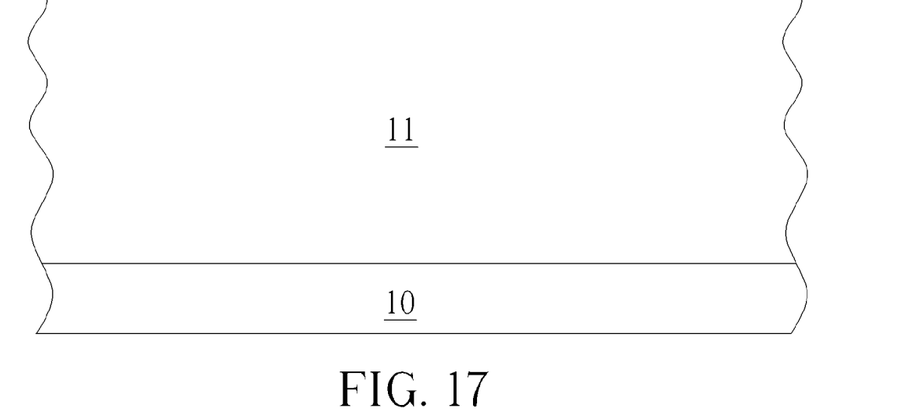

FIGS. 17-22 are schematic diagrams showing a method for fabricating a trench type power transistor device in accordance with still another embodiment of the invention. As shown in FIG. 17, likewise, a semiconductor substrate 10 having a fist conductivity type is provided. For example, the semiconductor substrate 10 may be an N+ heavily doped silicon substrate or wafer and may be act as a drain of the transistor device. An epitaxial growth process is performed to form an epitaxial layer 11 such as an N type epitaxial silicon layer or a P type epitaxial silicon layer on the semiconductor substrate 10.

Figure 18:
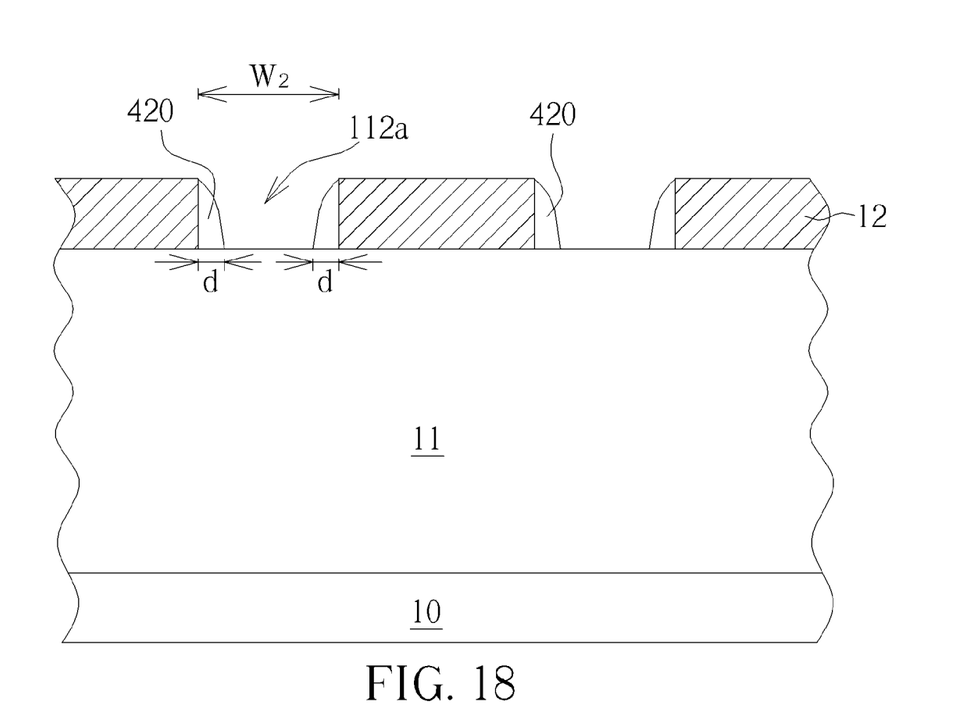

As shown in FIG. 18, a hard mask layer 12 such as a silicon oxide layer or silicon nitride layer is formed on a top surface of the epitaxial layer 11. A lithographic process and an etching process are carried out to form openings 112a in the hard mask layer 12. For example, the openings 112a are straight line-shaped and each of the openings 112a has a width W2. Subsequently, a sidewall spacer 420 is formed on each sidewall of the openings 112a. For example, the sidewall spacer 420 may be a silicon oxide or silicon nitride spacer, and has a width d (bottom width). The material of the spacer 420 is different from that of the hard mask layer 12. According to the embodiment, the width d may be about 0.5 micrometers, but not limited thereto.

Figure 19:
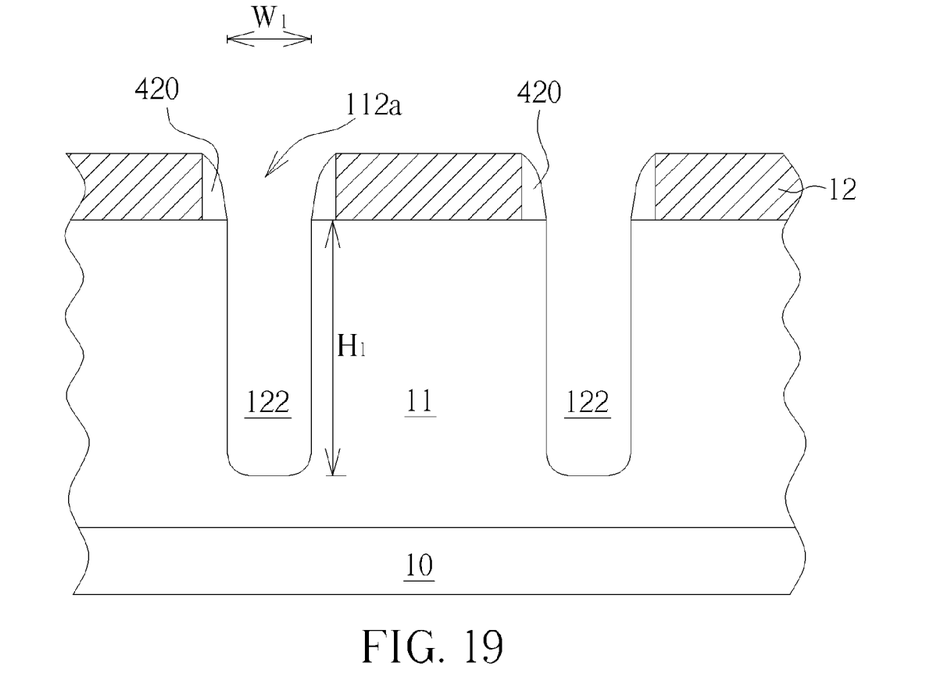

As shown in FIG. 19, using the hard mask layer 12 and the sidewall spacer 420 together as an etching hard mask, a dry etching process is performed to etch the epitaxial layer 11 through the openings 112a in the hard mask layer 12 to a depth H1, thereby forming trenches 122. Each of the trenches 122 has a width that is equal to the width W1. The depth H1 is smaller than the thickness of the epitaxial layer 11.

Figure 20:
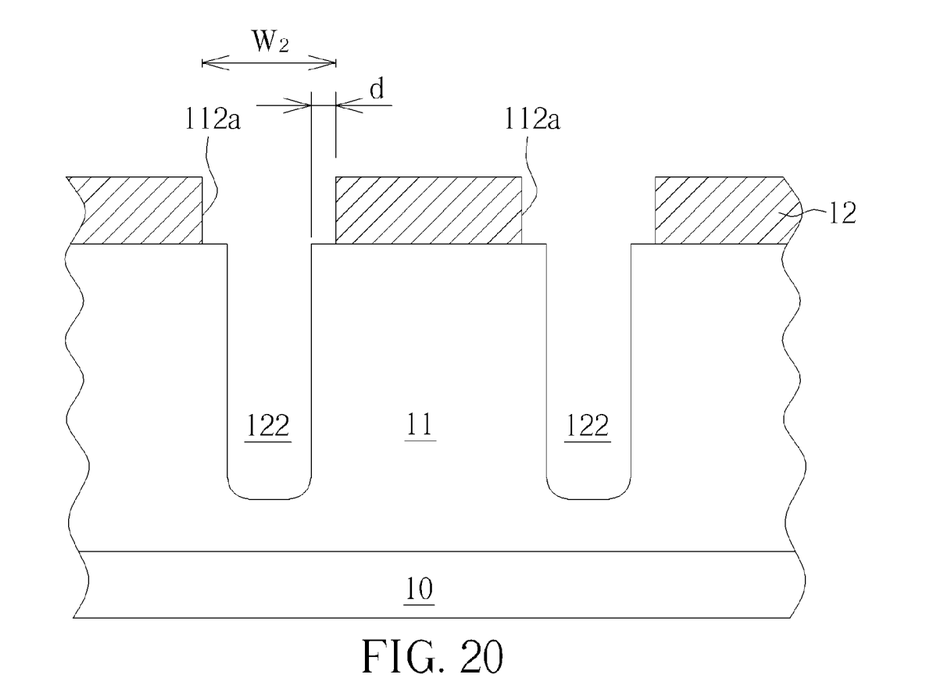

As shown in FIG. 20, the sidewall spacer 420 is removed to reveal upper corners 122a around the upper ends of the trench 122. According to the embodiment, the width d may be about 0.5 micrometers, but not limited thereto.

Figure 21:
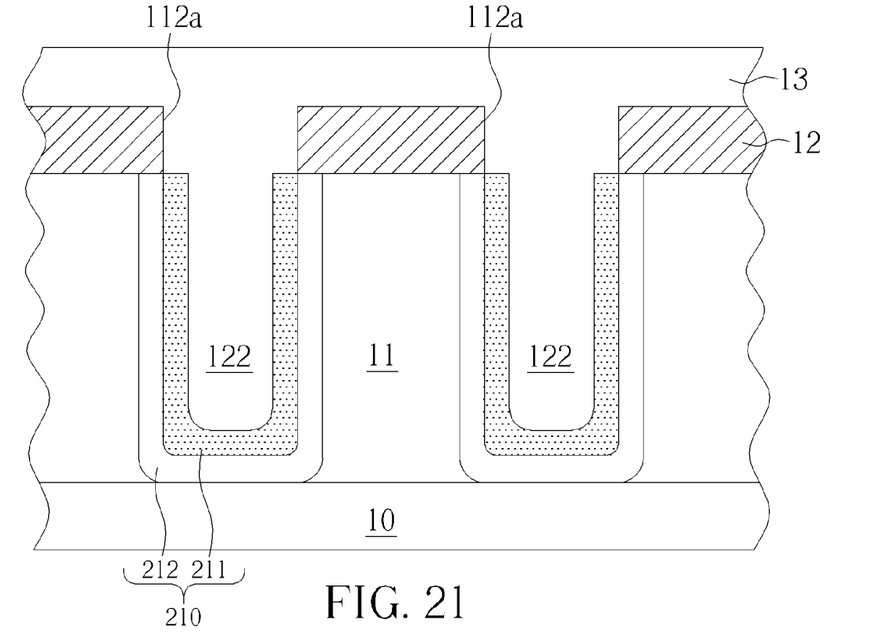

As shown in FIG. 21, the trenches 122 are filled with a doped polysilicon layer 13. According to the embodiment, the doped polysilicon layer 13 has a conductivity type that is opposite to the epitaxial layer 11. For example, when the epitaxial layer 11 is N type, the doped polysilicon layer 13 is P type and when the epitaxial layer 11 is P type, the doped polysilicon layer 13 is N type. According to the embodiment, the epitaxial layer 11 is N type. According to the embodiment, the doped polysilicon layer 13 may cover the hard mask layer 12. A high-temperature thermal drive-in process is then performed to diffuse dopants from the doped polysilicon layer 13 into the epitaxial layer 11, thereby forming the PN super junction structure.

At this point, the diffusion region 210 diffused into the epitaxial layer 11 includes a first region 211 that is closer to the surface of the trench 122 and a second region 212 that is formed deeper into the epitaxial layer 11. The first region 211 has a doping concentration that is higher than that of the second region 212. For example, the doping concentration of the first region 211 ranges between about 1E17 atoms/cm3 and 1E19 atoms/cm3, and the doping concentration of the second region 212 may be about 1E16 atoms/cm3, but not limited thereto. According to the embodiment, the width of the first region 211 is substantially equal to the width d of the sidewall spacer 420.

Figure 22:
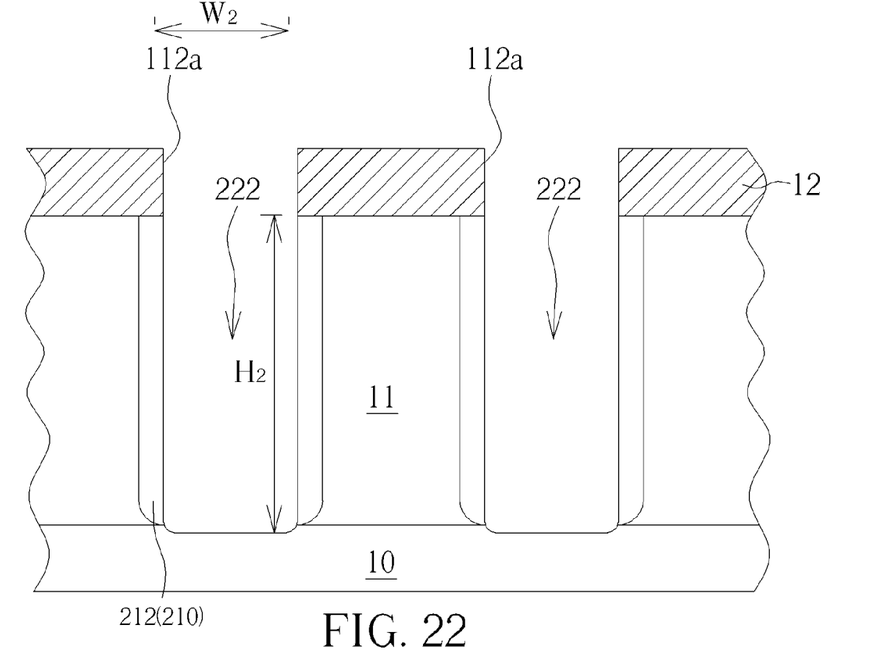

As shown in FIG. 22, a dry etching process is then performed, using the hard mask layer 12 as an etching hard mask, to completely etch away the doped polysilicon layer 13 and the epitaxial layer 11 in the first region 211, thereby forming trenches 222. The trench 222 has a width that is substantially equal to the width W2 of the opening 112a. The trench 222 has a depth H2 that is greater than the depth Hl of the trench 122. The depth H2 may be greater than or equal to the thickness of the epitaxial layer 11. It is noteworthy that when the epitaxial layer 11 is N type, the aforesaid trenches 222 may have an etched depth either penetrating through the epitaxial layer 11 or not penetrating through the epitaxial layer 11. However, when the epitaxial layer 11 is P type, the trenches 222 has an etched depth that has to be penetrating through the epitaxial layer 11.

It is one germane feature of the present invention that by using a second trench etching step, the doped polysilicon layer 13 and the high-concentration trench sidewall (first region 211 of the diffusion region 210) are both removed, such that the electrical performance and yield of the fabricated power semiconductor device with super junction structure are improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a power semiconductor device, comprising:
  providing a semiconductor substrate;
  forming an epitaxial layer on the semiconductor substrate;
  forming a hard mask layer on the epitaxial layer;
  forming at least one first opening in the hard mask layer;
  etching the epitaxial layer through the first opening to form at least one first trench;
  trimming the hard mask layer to enlarge the first opening to a second opening such that upper corners of the first trench are revealed;
  filling the first trench with a doped layer, said doped layer being direct contact with revealed said upper corners of the first trench;
  performing a thermal drive-in process to diffuse dopants from the doped layer into the epitaxial layer to thereby form a diffusion region in the first trench, wherein the diffusion region comprises a first region that is closer to surface of the first trench and a second region that is formed deeper into the epitaxial layer; and
  performing a dry etching process, using the trimmed hard mask layer as an etching hard mask, to completely etch away the doped layer and the epitaxial layer in the first region, thereby forming a second trench.

2. The method for fabricating a power semiconductor device according to claim 1, wherein after forming the second trench, the method further comprises:
  completely filling the second trench with an insulating layer;
  removing the hard mask layer; and
  forming a gate oxide layer and a gate on a top surface of the epitaxial layer.

3. The method for fabricating a power semiconductor device according to claim 2, wherein after forming the gate, the method further comprises:
  performing an ion implantation process to form an ion well in the epitaxial layer; and
  forming a source doping region in the ion well.

4. The method for fabricating a power semiconductor device according to claim 1, wherein the doped layer is a doped polysilicon layer.

5. The method for fabricating a power semiconductor device according to claim 1, wherein the first region has a doping concentration that is higher than that of the second region.

6. The method for fabricating a power semiconductor device according to claim 5, wherein the doping concentration of the first region ranges between about 1E17 atoms/cm$^3$ and 1E19 atoms/cm$^3$, and the doping concentration of the second region is about 1E16 atoms/cm$^3$.

7. The method for fabricating a power semiconductor device according to claim 1, wherein the first trench has a width that is equal to a width of the first opening, and a depth smaller than a thickness of the epitaxial layer.

8. The method for fabricating a power semiconductor device according to claim 1, wherein the second trench has a width that is equal to a width of the second opening.

9. The method for fabricating a power semiconductor device according to claim 8, wherein the second trench has a depth that is greater than a thickness of the epitaxial layer.

10. The method for fabricating a power semiconductor device according to claim 8, wherein the second trench has a depth that is smaller than a thickness of the epitaxial layer.

11. The method for fabricating a power semiconductor device according to claim 1, wherein the semiconductor substrate is an N+ heavily doped silicon substrate and acts as a drain of the power semiconductor device.

12. The method for fabricating a power semiconductor device according to claim 11, wherein the epitaxial layer is N type epitaxial silicon layer, and the doped layer and the diffusion layer are both P type.

13. The method for fabricating a power semiconductor device according to claim 11, wherein the epitaxial layer is P type epitaxial silicon layer, and the doped layer and the diffusion layer are both N type.

14. A method for fabricating a power semiconductor device, comprising:
  providing a semiconductor substrate;
  forming an epitaxial layer on the semiconductor substrate;
  forming a hard mask layer on the epitaxial layer;
  forming at least one first opening in the hard mask layer;
  forming a spacer on sidewall of the first opening;
  etching, through the first opening, the epitaxial layer to thereby form at least one first trench;
  removing the spacer to reveal upper corners of the first trench;
  filling the first trench with a doped layer, said doped layer being direct contact with revealed said upper corners of the first trench;
  performing a thermal drive-in process to diffuse dopants from the doped layer into the epitaxial layer to thereby form a diffusion region in the first trench, wherein the diffusion region comprises a first region that is closer to surface of the first trench and a second region that is formed deeper into the epitaxial layer; and
  performing a dry etching process, using the hard mask layer as an etching hard mask, to completely etch away the doped layer and the epitaxial layer in the first region, thereby forming a second trench.

15. The method for fabricating a power semiconductor device according to claim 14, wherein the doped layer covers the hard mask layer.

16. The method for fabricating a power semiconductor device according to claim 14, wherein the doped layer is a doped polysilicon layer.

17. The method for fabricating a power semiconductor device according to claim 14, wherein the first region has a doping concentration that is higher than that of the second region.

18. The method for fabricating a power semiconductor device according to claim 17, wherein the doping concentration of the first region ranges between about 1E17 atoms/cm$^3$ and 1E19 atoms/cm$^3$, and the doping concentration of the second region is about 1E16 atoms/cm$^3$.

19. The method for fabricating a power semiconductor device according to claim 14, wherein after forming the second trench, the method further comprises:
  completely filling the second trench with an insulating layer;
  removing the hard mask layer; and
  forming a gate oxide layer and a gate on a top surface of the epitaxial layer.

20. The method for fabricating a power semiconductor device according to claim 19, wherein after forming the gate, the method further comprises:
   performing an ion implantation process to form an ion well in the epitaxial layer; and forming a source doping region in the ion well.

21. A method for fabricating a power semiconductor device, comprising:
   providing a semiconductor substrate;
   forming an epitaxial layer on the semiconductor substrate;
   forming a hard mask layer on the epitaxial layer;
   forming a photoresist pattern on the hard mask layer, wherein the photoresist pattern has at least one first opening;
   etching the hard mask layer through the first opening to form at least a second opening;
   trimming the hard mask layer to enlarge the second opening to a third opening;
   etching the epitaxial layer through the first opening to thereby form at least one first trench, wherein upper corners of the first trench are revealed;
   removing the photoresist pattern;
   filling the third opening and the first trench with a doped layer, said doped layer being direct contact with revealed said upper corners of the first trench;
   performing a thermal drive-in process to diffuse dopants from the doped layer into the epitaxial layer to thereby form a diffusion region in the first trench, wherein the diffusion region comprises a first region that is closer to surface of the first trench and a second region that is formed deeper into the epitaxial layer; and
   performing a dry etching process, using the trimmed hard mask layer as an etching hard mask, to completely etch away the doped layer and the epitaxial layer in the first region, thereby forming a second trench.

\* \* \* \* \*